United States Patent [19]

White

[11] Patent Number: 4,699,830
[45] Date of Patent: Oct. 13, 1987

[54] LAMINATED SHEET MATERIAL FOR PACKAGING ELECTRONIC COMPONENTS

[75] Inventor: Creighton A. White, Valencia, Calif.

[73] Assignee: Baxter Travenol Laboratories, Inc., Deerfield, Ill.

[21] Appl. No.: 880,215

[22] Filed: Jun. 30, 1986

[51] Int. Cl.$^4$ ............................................. B65D 27/18
[52] U.S. Cl. ...................................... 428/35; 428/922; 428/458; 428/212; 428/412; 428/461; 428/462; 206/328
[58] Field of Search .................. 428/35, 922, 458, 212, 428/412; 206/328

[56] References Cited

U.S. PATENT DOCUMENTS

| 4,154,344 | 5/1979 | Yenni et al. | 206/328 |
|---|---|---|---|
| 4,407,872 | 10/1983 | Horii | 428/922 |
| 4,424,900 | 1/1984 | Petcavich | 428/922 |
| 4,496,406 | 1/1985 | Dedow | 429/922 |

OTHER PUBLICATIONS

BayStat Inc., "Transparent StaticShield Bags"; pp. 1-2 (no date).
RCAS brochure, "Shielding Bags"; pp. 5-6 (no date).
Crystal-X Corp., "Contrim Crystat Constat Product Description Brochure"; pp. 1-7 (no date).
American Pharmaseal Co., "Static Shield Bags"; pp. 1-2 (Aug. 1986).
The Dow Chemical Company, "Chiploc Electrostatic Shielding and Dissipative Packaging"; pp. 1-8 (1986)
Static Inc., "GridStat™ 9900 Static Shielding Bags"; pp. 1-2 (no date).
The Simco Company, Inc., "Simco-Stat Transparent Static Barrier Bags"; pp. 1-2 (May 1982).
Charleswater Products Inc., "Statshield (CP303) Transparent Conductive Bags"; p. 1 (no date).
Quality Packaging Supply Corp., "XT6000 Static Shielding Material"; p. 1 (no date).
Maine Poly Inc., "Conducto-Stat 3220" (patent pending); p. 1 (no date).
Static Control Systems Div/3M, "3M 2100 Statis Shielding Bag" brochure; pp. 1-6 (no date).

Primary Examiner—Edith Buffalow
Attorney, Agent, or Firm—Roger A. Williams; Paul C. Flattery; Roger E. Hartenberger

[57] ABSTRACT

A laminated sheet material which can be used to form packages or envelopes for electrically sensitive components. The laminated sheet material includes an antistatic layer providing a surface resistivity in the range from about $10^8$ to about $10^{13}$ ohms per square. A first conductive metal layer is adhered to the antistatic layer and provides a surface resistivity of less than about $10^5$ ohms per square. A carrier film layer is adhered to the first conductive metal layer. A second conductive metal layer is adhered to the carrier film layer. A transparent, protective topcoat layer is adhered to the second conductive metal layer for protecting the second conductive metal layer from abrasion and oxidation and for maintaining the outer surface resistivity of the combined clear protective layer and second conductive metal layer in the range from about $10^4$ to about $10^8$ ohms per square.

23 Claims, 2 Drawing Figures

LAMINATED SHEET MATERIAL FOR PACKAGING ELECTRONIC COMPONENTS

BACKGROUND OF THE INVENTION

The invention herein is directed to a laminated sheet material used in packaging for electrically sensitive components such as electronic components. Many electronic components such as metal oxide semi-conductor devices are sensitive to electrostatic discharges when in their component form and can be damaged by such electrostatic discharges prior to the components being installed in an electronic circuit.

Currently there are several commercially available packaging products made from laminated sheets for electrically shielding electronic components. One of such products is an antistatic shield bag manufactured and distributed by Minnesota Mining and Manufacturing Company. The envelope or package is described in U.S. Pat. No. 4,154,344. The envelope disclosed therein is constructed from a flexible material generally consisting of a laminated sheet material which can be folded upon itself. The inner surface of the envelope is an antistatic layer which is bonded to a carrier sheet and onto which is bonded a conductive metal layer. The metal layer can be coated with a protective coating to protect the metal layer from abrasion. Such an envelope provides a low surface resistivity that exhibits static dissipation and static shielding for components placed in the bag. A disadvantage of such a structure is that the protective coating can be violated exposing the metal layer to potential abrasion. If the conductive metallized layer is violated, the static dissipation or static shielding effect is lost in the area wherein the conductive metallized layer has been abraded. Abrasion of the metallized layer can occur during normal packaging and shipping of such envelopes. Therefore, such envelopes still require some degree of care and caution in handling and shipment in order to protect the sensitive electronic components.

Another product currently commercially available is the Ameri-Stat brand of static shielding bag made by American Hospital Supply Corporation. Such a shielding bag has one metallized shielding layer providing a conductive layer for dissipating static electricity. However, in the structure the metallized layer is buried within the laminated material comprising the sidewall of the envelope. The laminated sidewall has an inner antistatic layer of a polyethylene to which is bonded a metallized conductive layer using a polyurethane adhesive. A substrate or carrier layer is bonded over the metal layer. The substrate layer provides the backbone and general supporting film for the overall flexible sheet itself. The substrate layer can be any suitable material such as a polyester. An antistatic topical coating is applied over the substrate film. Such a structure readily protects the metallized layer. However, the surface resistivity on the outer layers is greater than that of shield bags wherein the metallized layer is on the outer surface of the substrate or carrier film. Since the outer layers are less conductive, they do not provide as low of a surface resistivity for providing static dissipation.

It would be desirable to provide a flexible sheet of material which could be used to create packaging for sensitive electrical components such as sensitive electronic componentry. It would be desirable that such a flexible sheet material be transparent and capable of being sealed upon itself. It would also be desirable to have a flexible sheet material which would provide a low surface resistivity on the outer surface and which would provide a secondary static shielding protection in the event the outer layers are compromised and the static dissipation or static shielding properties of such outer layer are lessened.

SUMMARY OF THE INVENTION

The invention herein is directed to a laminated sheet material which can exhibit a low surface resistivity on one of its surfaces to provide static dissipation and static shielding. The material also provides a secondary shielding layer within the material to provide electrostatic shielding protection. The laminated sheet material essentially consists of five layers which can be categorized into three groups. The first group is an antistatic layer which would provide a surface resistivity in the range from about $10^8$ to about $10^{13}$ ohms per square. When the laminated sheet is formed into a package such as an envelope, the antistatic layer would be toward the inside or compartment of the package or envelope. The second group of layers is the metallized substrate layer. The group includes one layer of a carrier or substrate sheet which provides the general, overall strength to the sheet material. The substrate is coated on both of its major surfaces with a conductive metal coating. The third group of the laminated structure is the protective layer which is adhered to the conductive metal layer on the substrate layer opposite the antistatic layer. The antistatic layer is adhered to the remaining conductive metal layer on the substrate. The antistatic layer can be bonded by any suitable means such as the use of an additional layer of adhesive.

More particularly, the invention herein is directed to a laminated sheet material for forming packaging for electrically sensitive components. The laminated sheet has an antistatic layer which provides a surface resistivity in the range from about $10^8$ to about $10^{13}$ ohms per square. The antistatic layer can be any heat sealable material such as a polyolefin based material. Adhered to the antistatic layer is a first conductive metal layer which provides a surface resistivity of less than about $10^5$ ohms per square. The first conductive metal layer can be adhered to the antistatic layer by any suitable means such as through the use of an adhesive layer. Bonded to the first conductive metal layer is a carrier film layer which provides the strength to the overall laminated sheet material. The carrier film layer is a transparent polymeric material and can be selected from any suitable materials such as polyesters, polycarbonates, polypropylenes, and nylons. A second conductive metal layer is adhered to the remaining surface of the carrier film layer opposite the first conductive metal layer. A clear or transparent protective layer is adhered to the second conductive metal layer for protecting the second conductive metal layer from abrasion and oxidation. The transparent protective layer is selected from a material which, when combined with the second conductive metal layer, will maintain an outer surface resistivity in the range from about $10^4$ to about $10^8$ ohms per square. The protective layer can be selected from any suitable material such as polyester based coatings or acrylic based coatings.

The antistatic layer is selected from a material which can provide a bonding to itself through any suitable means. A particularly preferred antistatic layer is a heat sealable material which can bond to itself upon the application of heat and/or pressure. The laminated sheet material can thereby be formed into packaging such as envelopes by folding one such sheet, and then heat sealing the antistatic layers to themselves by application of heat and/or pressure. One exposed edge can be left open so as to provide an opening for the introduction of products, such as electronic components, into the formed package or envelope. Such an opening can be subsequently sealed by heat sealing.

BRIEF DESCRIPTION OF THE DRAWINGS

These and other features, aspects, and advantages of the present invention will be better understood with reference to the appended claims, the following description, and accompanying drawings wherein:

DETAILED DESCRIPTION

Figure 1:
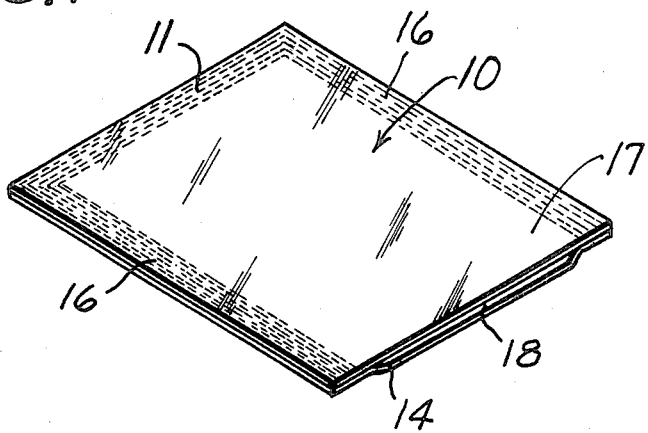
FIG. 1 is a perspective view of an envelope package constructed from the laminated sheet material herein.

Now referring to FIG. 1, there is shown a package for electronic components which is a flexible envelope 10 into which the electronic components can be inserted. The envelope 10 has a flexible first laminated sidewall 12 and a flexible second laminated sidewall 14, which is an extension of the sheet material comprising the first laminated sidewall. The envelope provides a static shielding protection for any sensitive electronic components placed in the envelope.

The envelope 10 is formed from a single sheet of laminated material which is folded to form the laminated sidewalls 12 and 14. The folded sheet of material is sealed along its edges using any convenient sealing technique such as by heat seals 16 to form a closure of the edges of the sheet material. The fourth side or edges of the two ends of the folded sheet of material is left open to provide an opening 18 through which objects can be inserted into the compartment portion of the envelope. Through a subsequent sealing process, such as heat sealing, the opening 18 can be closed.

Figure 2:
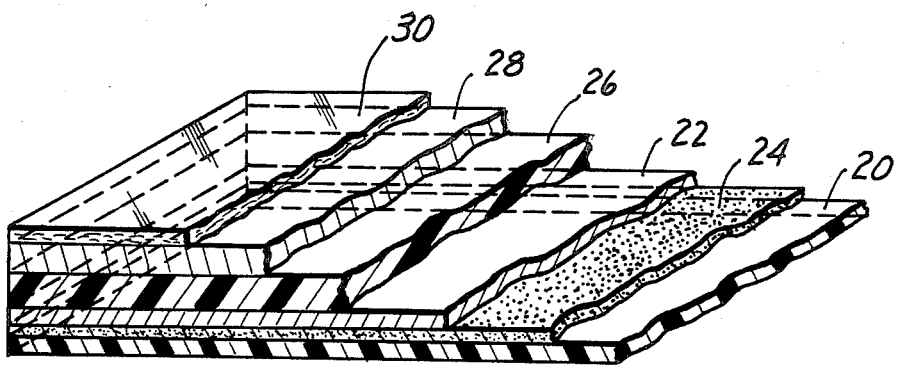
FIG. 2 is a perspective cross-sectional view of the laminated sheet material herein illustrating the various layers.

The flexible laminated sheet material from which the packaging envelope 10 is constructed is shown in FIG. 2. The laminted sheet material shown in FIG. 2 will be described with regard to the various layers. The laminated sheet material includes an antistatic layer 20. The antistatic layer can be formed from any suitable material providing antistatic or electrical dissipative properties. The antistatic layer is preferably constructed from a material which can be sealed to itself such as through the application of heat and/or pressure. The antistatic layer should be durable and resistive to abrading by the presence of components placed in a package constructed from such material.

The antistatic layer serves as the inner layer for any package constructed from the laminated sheet material. For example, with regard to FIG. 1 the antistatic layer 20 would be the exposed surfaces on the interior of the envelope shown therein. The antistatic layer generally has a thickness in the range from about 0.001 to about 0.005 inches. The antistatic layer can be selected from a material which provides a surface resistivity in the range from about $10^8$ to about $10^{13}$ ohms per square.

Antistatic materials which can be used for the antistatic layer include polyolefin based materials. It has been found that such polyolefins have the desirable heat sealable properties and can be imparted with the desired antistatic properties. For example, polyolefins can be selected which have been bulk treated during their compounding step through the addition of an additive which minimizes charge generation. Polyolefins can be selected which have been surface treated with topical materials to provide the desired antistatic properties. Polyolefins can be selected which naturally exhibit the characteristic antistatic property without the need for any additional additive. Further, polyolefins that have been bulk treated and which have been subsequently topically coated can be used. The polyolefin based materials are preferred as some can be permanently modified to maintain their antistatic properties through the introduction of an additive, then the performance of a processing step on the polyolefin and additive admixture such as through electron beam treatment. A preferred surface resistivity for the antistatic polyolefin based material would be a surface resistivity of from about $10^8$ to about $10^{13}$ ohms per square.

The laminated sheet material includes a first conductive metal layer 22 which is a buried metal layer that is sandwiched between the antistatic layer and the carrier or substrate layer 26, which substrate layer will be more fully described hereinafter. The first conductive metal layer 22 is a continuous metal layer which can be deposited on the substrate by any available means such as vacuum or sputter metallization. The first metal layer is provided in a thickness which provides a transparency to the layer. The metal is deposited onto the substrate layer in a thin layer to allow transmission of light through the metal layer. The thickness of the metal layer can vary depending upon the metal selected since the controlling criteria for the amount of metal in the layer is the preferred surface resistivity to be provided by the metal layer. For the laminated sheet material herein, it is preferred that the metal layer provide a surface resistivity of less than $10^5$ ohms per square. More preferably, the metal is deposited to provide a surface resistivity of about $10^2$ ohms per square or less. At such a surface resistivity, the buried metal layer 22 provides the protection of a Faraday cage to the overall structure of a package or envelope formed from such laminated sheet material. The metal that is used in the first conductive metal layer can be any suitable metal. Preferred metals can be any metal selected from the group consisting of aluminum, nickel, cadmium, tin, chromium, lead, copper, zinc, and combinations or compounds thereof. The preferred metal for use in the first conductive layer is aluminum.

In some applications, it is difficult to bond the antistatic layer 20 to a metal surface such as provided by the first conductive metal layer 22. Any suitable material or technique can be used to bond the antistatic layer 20 to the first conductive metal layer 22. In a particularly preferred embodiment of the laminated sheet material herein, an adhesive is used to bond the two layers together. The adhesive can be selected from any suitable adhesive and adhesives which can be used include urethane based formulas, acrylic based formulas, and any other thermoplastic pressure, heat sensitive adhesive. A particularly preferred adhesive is a urethane based adhesive wherein the antistatic layer is a polyolefin based material and the first conductive metal layer is aluminum. The adhesive is applied in an amount from about 0.5 to about 3.0 pounds per ream of laminated sheet material to be formed.

The next layer in the laminated sheet material shown in FIG. 2 is the substrate or carrier sheet 26. The substrate layer 26 serves the dual purpose of providing a carrier for the metal layers and providing a strong, transparent, durable, packaging material. The substrate layer 26 thus provides the backbone for the overall sheet material and any package formed therefrom. Materials which can be selected for the substrate layer are polyester, polycarbonate, polypropylene, and nylon. The preferred material is polyester. The substrate layer preferably has a thickness in the range from about 0.00025 to about 0.002 inches. Polyester is a preferred substrate of choice as it can be readily electro-deposited with metals and it provides the strength and transparency.

The laminated sheet material herein includes a second conductive metal layer 28 which is adhered to the remaining surface (i.e., outer surface) of the substrate 26. The second conductive metal layer 28 can be adhered, bonded, or deposited onto the substrate 26 using any conventional technique such as vacuum or sputter metallization. The thickness of the second conductive metal layer varies with the metal selected for the layer. The controlling criteria for the amount of metal deposited or present in the metal layer is the surface resistivity to be provided by the second conductive layer after a protective topcoat is applied to the second conductive metal layer. Preferably, the second conductive metal layer and its associated protective layer provides a surface resistivity in the range of from about $10^4$ to about $10^8$ ohms per square. A particularly preferred level of deposition yields a surface resistivity of less than about $10^5$ ohms per square after the protective topcoat layer is applied. This range of surface resistivity is preferred as the second conductive metal layer provides a rapid, static discharge capability to ground for effectively bleeding any charges introduced to the surface of the structure. In addition to this primary function of the second conductive metal layer, the layer can exhibit or enhance the effect of the Faraday cage for the overall structure of a package constructed from the laminated sheet material. Should the conductive metal layer 28 be compromised, the protected, buried conductive metal layer 22 will provide shielding protection. Metals from which the second conductive metal layer can be formed include metals selected from the group of aluminum, nickel, cadmium, tin, chromium, lead, copper, zinc, and compounds and mixtures thereof. The preferred metal of choice is aluminum.

It is preferred that the first conductive metal layer, substrate, and second conductive metal layer provide a light transmission in the range from about 15% to about 70% and, more preferably, a light transmission range of 30% to 45%. The three layers are selected to provide such a light transmittance as it is desirable to provide a laminated sheet material for packaging or envelopes wherein any component placed in the package or envelope can be readily viewed through the sidewall.

The laminated sheet material also includes a protective layer 30 which is coated over the second conductive metal layer 28. The protective layer 30 is formed from a material which provides a transparent protective topcoating to the second conductive metal layer 28. The protective layer 30 inhibits and/or prevents abrasion and oxidation of the second conductive metal layer 28. The protective layer can have a thickness which varies depending upon the material selected and the properties of the second conductive metal layer. The protective layer 30 and second conductive metal layer 28 preferably exhibit a combined surface resistivity from about $10^4$ to about $10^8$ ohms per square and, more preferably, a surface resistivity of less than about $10^5$ ohms per square. The protective layer 30 provides a clear, scratch, and abrasive resistant coating over the second conductive metal layer so that the second conductive metal layer would be protected from being compromised by scratching or abrasion. The protective layer 30 also provides the controlling resistance in the circuitry of the structure for maintaining the outer surface resistivity at the desired level so that the static discharge rate for the material can be controlled. The protective layer 30 also provides an oxidation protection to the second conductive metal layer so that the metal does not oxidize to form metal oxides which would reduce the resistivity of the exposed surface. The protective layer 30 can possess some inherent conductive properties in order to provide the desired surface resistivity for the combined protective layer and second conductive metal layer 28. Preferred material from which the protective layer 30 can be formed include acrylic or polyester based coatings.

The laminated sheet material herein can be used to construct packaging such as an envelope shown in FIG. 1. The envelopes can be used for packaging and protecting static sensitive circuit boards or other electronic components. The envelopes provide a transparent, metallized shielding bag construction offering abrasion and metal oxidation resistance, low surface resistivity, and two layers of protection for the components stored or packaged in the envelope. The laminated sheet material herein can be constructed to provide an overall thickness in the range from about 3 to about 4 mils. This is a desirable range of sizes as it can be readily used for packaging and retain its transparency. The laminated sheet material provides a primary shielding layer in the first conductive metal layer which has a surface resistivity of less than $10^2$ ohms per square and this primary shielding layer is buried between the substrate layer and the antistatic layer which provides a maximum abrasion resistance to such primary shielding layer. The laminated sheet material also provides an outer surface having a desired static dissipative range. The laminated sheet material also provides an inner layer that is clearly antistatic having a surface resistivity of greater than $10^8$ ohms per square. The laminated sheet material also provides a material which can be readily sealed upon itself through conventional sealing techniques such as heat and/or pressure sealing. An envelope constructed from the preferred sheet material herein provided shielding effectiveness for the complete structure when tested with a 1,000 volt charge on the outside surface using the Electronic Industries Association recognized electrostatic shielding test.

I claim:
1. A laminated sheet material for forming packaging for electrically sensitive components, the laminated sheet material comprising:
   an antistatic layer providing a surface resistivity in the range from about $10^8$ to about $10^{13}$ ohms per square;
   a first conductive metal layer adhered to the antistatic layer and having a surface resistivity of less than about $10^5$ ohms per square;
   a carrier film layer adhered to the first conductive metal layer;

a second conductive metal layer adhered to the carrier film layer; and a clear protective layer adhered to the second conductive metal layer for protecting the second conductive metal layer from abrasion and oxidation and for maintaining the outer surface resistivity of the combined second conductive metal layer and clear protective layer in the range from about $10^4$ to about $10^8$ ohms per square.

2. A laminated sheet material as recited in claim 1 wherein the antistatic layer comprises a heat sealable material.

3. A laminated sheet material as recited in claim 2 wherein the antistatic layer comprises a polyolefin based material.

4. A laminated sheet material as recited in claim 1 wherein the first conductive metal layer, carrier layer, and second conductive metal layer have a combined light transmission in the range from about 15% to about 70%.

5. A laminated sheet material as recited in claim 4 wherein the first conductive metal layer, carrier layer, and second conductive metal layer have a combined light transmission in the range from about 30% to about 45%.

6. A laminated sheet material as recited in claim 1 wherein the first conductive metal layer comprises a continuous layer of a conductive metal.

7. A laminated sheet material as recited in claim 6 wherein the conductive metal is selected from the group consisting of aluminum, nickel, cadmium, tin, chrome, lead, copper, zinc, and compounds and mixtures thereof.

8. A laminated sheet material as recited in claim 7 wherein the metal is aluminum.

9. A laminated sheet material as recited in claim 1 wherein the first conductive metal layer has a surface resistivity less than $10^2$ ohms per square.

10. A laminated sheet material as recited in claim 1 wherein the carrier layer comprises a transparent polymeric material selected from the group consisting of polyester, polycarbonate, polypropylene, and nylon.

11. A laminated sheet material as recited in claim 10 wherein the carrier layer comprises polyester.

12. A laminated sheet material as recited in claim 10 wherein the carrier layer has a thickness in the range from about 0.0025 to about 0.002 inches.

13. A laminated sheet material as recited in claim 1 wherein the second conductive metal layer comprises a continuous layer of conductive metal.

14. A laminated sheet material as recited in claim 13 wherein the conductive metal layer is selected from the group consisting of aluminum, nickel, cadmium, tin, chromium, lead, copper, zinc, and compounds and mixtures thereof.

15. A laminated sheet material as recited in claim 14 wherein the conductive metal comprises aluminum.

16. A laminated sheet material as recited in claim 13 wherein the second conductive metal layer and protective layer provide a surface resistivity of less than about $10^5$ ohms per square.

17. A laminated sheet material as recited in claim 16 wherein the protective layer comprises an acrylic based coating.

18. A laminated sheet material as recited in claim 16 wherein the protective layer comprises a polyester based coating.

19. A laminated sheet material as recited in claim 1 further comprising an adhesive layer between the antistatic layer and the first conductive metal layer for bonding the antistatic layer to the first conductive metal layer.

20. A laminated sheet material as recited in claim 19 wherein the adhesive layer comprises a thermoplastic pressure/heat sensitive adhesive.

21. A laminated sheet material as recited in claim 20 wherein the adhesive layer comprises a urethane based adhesive.

22. A laminated sheet material as recited in claim 20 wherein the adhesive layer comprises an acrylic based adhesive.

23. An envelope formed from the laminated sheet material recited in claim 1 wherein the static layer comprises the inner surface of the envelope and is sealed to itself to provide closure of the envelope.

* * * * *